(12) United States Patent
Hu et al.

(10) Patent No.: US 12,730,960 B2
(45) Date of Patent: Sep. 8, 2026

(54) DEVICES WITH TRACK-BASED FILL (TBF) METAL PATTERNING

(71) Applicant: TAIWAN SEMICONDUCTOR MANUFACTURING COMPANY, LTD., Hsinchu (TW)

(72) Inventors: Wei-Yi Hu, Hsinchu (TW); Chih-Ming Chao, Hsinchu (TW); Jung-Chou Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/526,324

(22) Filed: Dec. 1, 2023

(65) Prior Publication Data

US 2024/0095439 A1 Mar. 21, 2024

Related U.S. Application Data

(63) Continuation of application No. 18/152,983, filed on Jan. 11, 2023, which is a continuation of application (Continued)

(51) Int. Cl.

*G06F 30/30* (2020.01)
*G03F 1/36* (2012.01)

(Continued)

(52) U.S. Cl.

CPC ............. *G06F 30/398* (2020.01); *G03F 1/36* (2013.01); *G06F 30/392* (2020.01)

(58) Field of Classification Search

CPC ......... G06F 30/398; G06F 30/392; G03F 1/36
See application file for complete search history.

(56) References Cited

U.S. PATENT DOCUMENTS 5,357,140 A 10/1994 Kozasa
7,260,442 B2 8/2007 Hwang et al.

(Continued)

FOREIGN PATENT DOCUMENTS

CN 101217118 7/2008
CN 107564828 1/2018

(Continued)

OTHER PUBLICATIONS

Office Action dated Aug. 3, 2022 from corresponding case No. TW11120771380 (pp. 1-8).

*Primary Examiner* — Jack Chiang
*Assistant Examiner* — Brandon Bowers
(74) *Attorney, Agent, or Firm* — Hauptman Ham LLP

(57) ABSTRACT

Disclosed are semiconductor devices having an interconnection pattern that includes a plurality of parallel conductors including a first conductor aligned with a first axis and a first dummy pattern aligned with a second axis on a first side of the first axis and offset from the first axis by an axis offset distance $L_{AO}$ in which the first dummy pattern includes N dummy conductors having a first dummy conductor length $L_{DC}$ with the dummy conductors being separated by a dummy conductor-to-dummy conductor spacing $EE_D$.

20 Claims, 11 Drawing Sheets

Related U.S. Application Data

No. 16/573,698, filed on Sep. 17, 2019, now Pat. No. 11,556,691.

(60) Provisional application No. 62/739,035, filed on Sep. 28, 2018.

(51) Int. Cl.
*G06F 30/392* (2020.01)
*G06F 30/398* (2020.01)

(56) References Cited

U.S. PATENT DOCUMENTS

| | | | | |
|---|---|---|---|---|
| 7,392,496 | B1 | 6/2008 | Schultz et al. | |
| 7,446,352 | B2 | 11/2008 | Becker et al. | |
| 9,256,709 | B2 | 2/2016 | Yu et al. | |
| 9,659,138 | B1 | 5/2017 | Powell et al. | |
| 10,192,021 | B1 | 1/2019 | Raj et al. | |
| 10,296,703 | B1 | 5/2019 | Juneja et al. | |
| 10,747,937 | B2 * | 8/2020 | Park | G06F 30/398 |
| 2001/0039647 | A1 | 11/2001 | Mori et al. | |
| 2001/0042921 | A1 | 11/2001 | Mori et al. | |
| 2002/0063335 | A1 * | 5/2002 | Ozawa | H01L 23/528 257/E23.151 |
| 2006/0084261 | A1 * | 4/2006 | Iwaki | H01L 27/0207 438/587 |
| 2007/0210391 | A1 | 9/2007 | Becker et al. | |
| 2007/0272949 | A1 * | 11/2007 | Shinomiya | G06F 30/394 257/E23.151 |
| 2008/0120586 | A1 | 5/2008 | Hoerold | |
| 2010/0011333 | A1 | 1/2010 | Becker et al. | |
| 2010/0193960 | A1 | 8/2010 | Mashita et al. | |
| 2012/0168958 | A1 | 7/2012 | Zhang et al. | |
| 2012/0205746 | A1 | 8/2012 | Wang | |
| 2012/0284679 | A1 | 11/2012 | Tetelbaum | |
| 2012/0288786 | A1 * | 11/2012 | Huang | G03F 1/38 430/315 |
| 2014/0040838 | A1 | 2/2014 | Liu et al. | |
| 2015/0091188 | A1 * | 4/2015 | Lee | H01L 27/0207 257/774 |
| 2015/0278429 | A1 | 10/2015 | Chang | |
| 2015/0294057 | A1 | 10/2015 | Lin et al. | |
| 2017/0263550 | A1 | 9/2017 | Nishida et al. | |
| 2017/0338172 | A1 * | 11/2017 | Yosui | H01L 23/49822 |
| 2019/0236238 | A1 * | 8/2019 | Park | G06F 30/398 |
| 2020/0019670 | A1 | 1/2020 | Chang et al. | |

FOREIGN PATENT DOCUMENTS

| | | |
|---|---|---|
| TV | 200917331 | 4/2009 |
| TW | 101178744 | 5/2008 |
| TW | 200901282 | 1/2009 |

* cited by examiner 100D
116D
102
104
106
114D
108A
108B
108C
108D
110
112

DEVICES WITH TRACK-BASED FILL (TBF) METAL PATTERNING

PRIORITY CLAIM

This application is a continuation of U.S. patent application Ser. No. 18/152,983, filed Jan. 11, 2023, which was a continuation of U.S. patent application Ser. No. 16/573,698, filed Sep. 17, 2019, now U.S. Pat. No. 11,556,691, issued Jan. 17, 2023, and which claimed the priority of U.S. Provisional Application No. 62/739,035, filed Sep. 28, 2018, each of which are incorporated herein by reference in their entireties.

BACKGROUND

The semiconductor integrated circuit (IC) industry has continued to experience rapid growth with technological advances in IC materials and design producing successive generations of ICs, each new generation having smaller geometries and more complex circuits than the previous generation. The complexity of the associated layout, device structures, and manufacturing processes for producing each new generation of ICs has increased correspondingly to achieve the designed functional density.

The performance of advanced patterning and etching processes associated with metal patterning are affected by density gradient effects (DGE) associated with the specific IC device layout configuration being manufactured. Consideration and adjustment of the relative location and spacing of the main conductive lines or main conductive pattern (those portions of lines or lines of a conductive pattern that carry signals and/or power in the completed IC device) using dummy conductive patterns (those portions or lines of a conductive pattern that will not carry signals and/or power in the completed IC device) mitigates some of the DGE and improves the uniformity and performance of the resulting ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
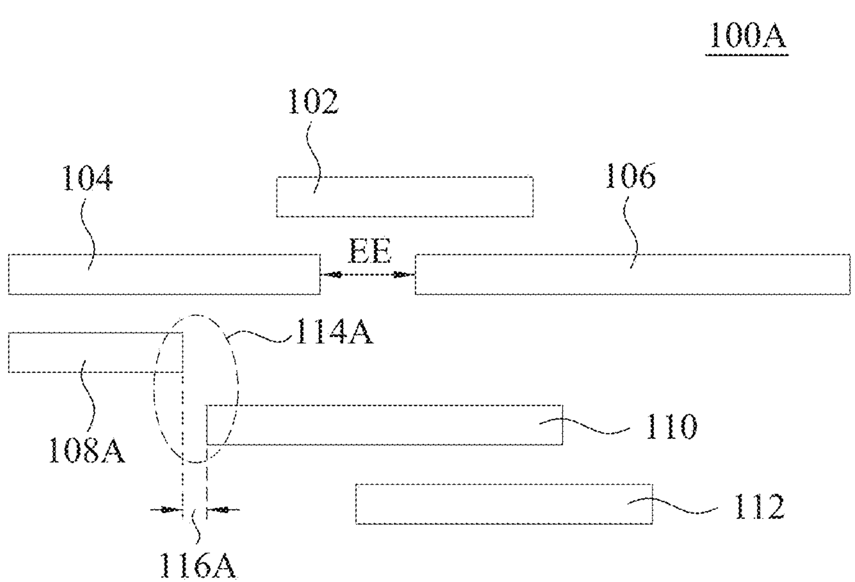
FIGS. 1A-1E are a top views of integrated circuit layout cells including a pattern of horizontal parallel conductive lines arranged along five evenly spaced tracks and includes a series of iterative line-end-extension (LEE) adjustments according to some embodiments.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

In some embodiments, the initial layout of conductive patterns used in manufacturing an integrated circuit device includes large open areas between the functional, i.e., main conductive lines and/or patterns. Depending on the size, number, and placement, in some embodiments the open areas result in degradation of the patterning and/or etching of the main conductive lines. Because the main conductive lines are used to achieve the designed function and/or operation of the integrated circuit device manufactured using such a layout, any degradation in the formation of such structures is detrimental to the operation and reliability of the resulting devices. According to some embodiments, the potential for such degrading effects resulting from excessive gaps in the conductive pattern is mitigated through the addition of dummy metal patterns during an automatic placement and routing (APR) process.

In some embodiments, the initial termination portion of a main conductive line is extended (using a track-based fill extension (TBF) process) with a dummy pattern to reduce the end-to-end spacing between the main conductive line and a second main conductive line and/or an adjacent isolated dummy pattern (a dummy pattern which is not in direct electrical contact with a main conductive line). In some embodiments, the open space between two main conductive lines and/or elements is reduced with the placement of one or more dummy patterns (using a track-based fill extension (TBF) process). In some embodiments, an array of smaller dummy patterns is used to reduce the parasitic capacitance to a level below that which would be associated with a single dummy pattern of similar overall length. In some embodiments, dummy patterns selected from a dummy pattern library and/or generated during the routing process in response to the layout analysis according to certain formulae and structural guidelines reduces the design iterations used in some methods to obtain an acceptable IC design layout, thereby simplifying and/or shortening the design layout process.

FIG. 1A is a top view of integrated circuit layout cell 100A including a pattern of horizontal parallel conductive lines arranged along five evenly spaced tracks. Conductive pattern layout 100A includes conductive elements 102, 104, 105, 108A, 110, 112 arranged along a series of horizontal parallel tracks. Depending on the IC design layout in the level of the conductive pattern, the conductive elements are connected to source/drain regions, gate electrodes, bulk contacts, and/or other conductive patterns (not shown) to form a portion of the interconnections on the IC device. According to applicable design rules, the ends of the respective conductive elements are separated by a minimum end-to-end distance (also referred to as EE or E2E) in order to improve the patterning operation and/or reduce the likelihood of shorts between closely positioned conductive elements following a manufacturing process. With respect to the conductive pattern 100A, the spacing 116A between the ends of conductive elements 108A and 110 in region 114A, have an initial spacing 116A less than the target EE. For some embodiments according to FIG. 1A, spacings such as 116A, which fall below the minimum EE spacing, are corrected by extending one of the conductive patterns in a process referred to as line-end-extension (LEE) in which an additional segment of conductive material will be added to establish an overlap between the opposing ends of the conductive elements.

Figure 1B:
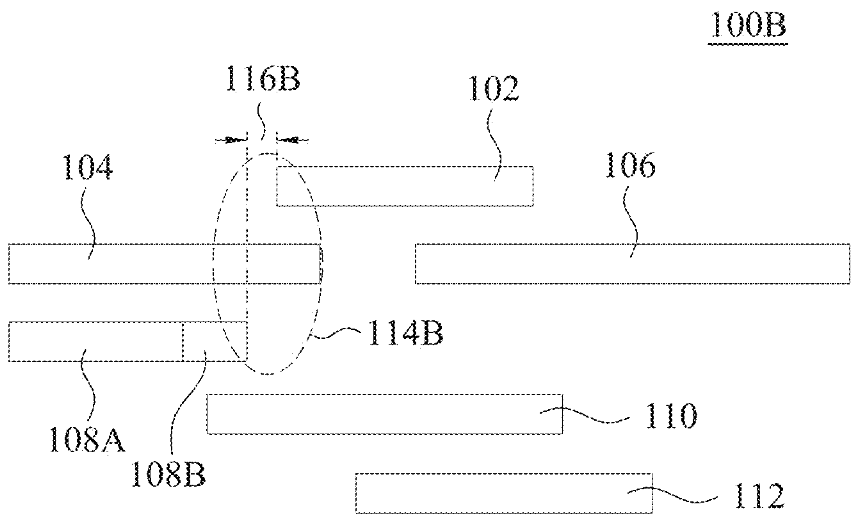

FIG. 1B is a top view of integrated circuit layout cell 100B including a pattern of horizontal parallel conductive lines arranged along five evenly spaced tracks. Conductive pattern layout 100B includes conductive elements 102, 104, 105, 108A, 110, 112 arranged along a series of horizontal parallel tracks with the addition of an additional segment 108B to the original segment 108A sufficient to resolve the spacing issue found in region 114A of FIG. 1A. With respect to the conductive pattern 100B, however, the spacing 116B between the ends of conductive elements 108A+108B and 102 in region 114B, have a current modified end-to-end spacing 116B of less than the target EE. For some embodiments according to FIG. 1B, spacings such as 116B, which fall below the minimum EE spacing, are corrected by extending one of the conductive patterns 102 or 108A+108B via LEE in which an additional segment of conductive material will be added to establish an overlap between the opposing ends of the conductive elements that are below the target EE.

Figures 1C, 1D:
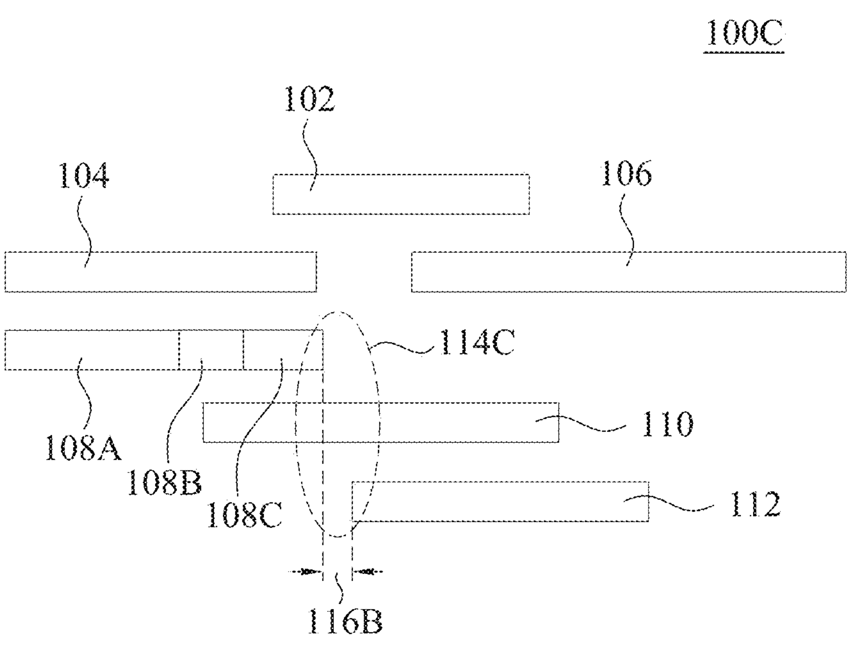

FIG. 1C is a top view of integrated circuit layout cell 100C including a pattern of horizontal parallel conductive lines arranged along five evenly spaced tracks. Conductive pattern layout 100C includes conductive elements 102, 104, 105, 108A+108B, 110, 112 arranged along a series of horizontal parallel tracks with the addition of an additional segment 108C to the previous segment 108A+108B sufficient to resolve the spacing issue found in region 114B of FIG. 1B. With respect to the conductive pattern 100C, however, the spacing 116C between the ends of conductive elements 108A+108B+108C and 112 in region 114C, have a current modified end-to-end spacing 116C of less than the target EE. For some embodiments according to FIG. 1C, spacings such as 116C, which fall below the minimum EE spacing, are corrected by extending one of the conductive patterns 112 or 108A+108B+108C via LEE in which an additional segment of conductive material will be added to establish an overlap between the opposing ends of the conductive elements.

FIG. 1D is a top view of integrated circuit layout cell 100D including a pattern of horizontal parallel conductive lines arranged along five evenly spaced tracks. Conductive pattern layout 100D includes conductive elements 102, 104, 105, 108A+108B+108C, 110, 112 arranged along a series of horizontal parallel tracks with the addition of an additional segment 108D to the modified conductive element 108A+108B+108C sufficient to resolve the spacing issue found in region 114C of FIG. 1C. With respect to the conductive pattern 100D, however, the spacing 116D between the ends of conductive elements 108A+108B+108C+108D and 106 in region 114C, have a current modified end-to-end spacing 116D of less than the target EE. For some embodiments according to FIG. 1D, spacings such as 116D, which fall below the minimum EE spacing, are corrected by extending one of the conductive patterns 106 or 108A+108B+108C+108D via LEE in which an additional segment of conductive material will be added to establish an overlap between the opposing ends of the conductive elements.

Figure 1E:
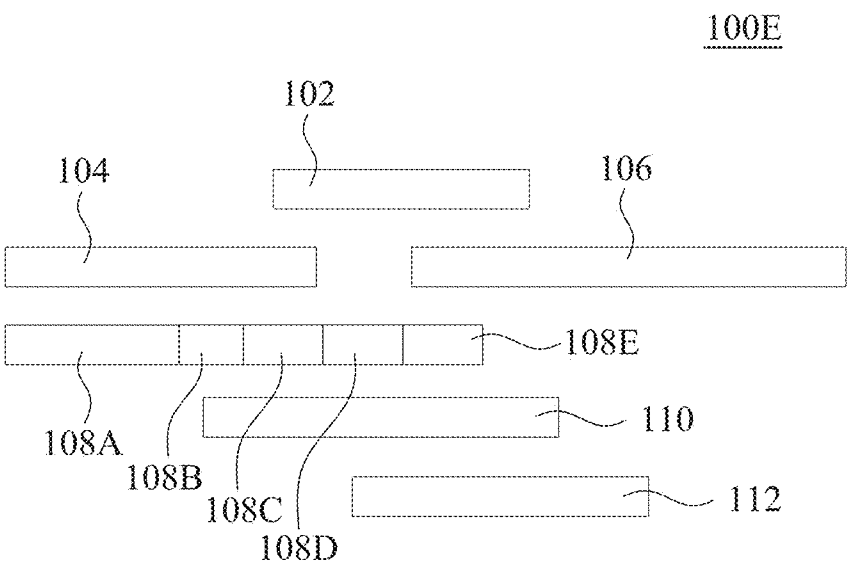

FIG. 1E is a top view of integrated circuit layout cell 100E including a pattern of horizontal parallel metal lines arranged along five evenly spaced tracks. Conductive pattern layout 100E includes conductive elements 102, 104, 105, 108A+108B+108C+108D, 110, 112 arranged along a series of horizontal parallel tracks with the addition of an additional segment 108E to the modified conductive element 108A+108B+108C+108D sufficient to resolve the spacing issue found in region 114D of FIG. 1D. With respect to the conductive pattern 100E, this fifth additional segment is sufficient to resolve all EE spacing issues within the conductive pattern 100E without creating a new EE spacing issue.

As in FIGS. 1A-1E, using the line-end-extension technique resolves spacing issues, however, in some instances, an initial EE spacing issue is resolved while simultaneously creating a new EE spacing issue. Accordingly, the iterative and unpredictable nature of LEE as applied in this manner is both slow and difficult to optimize, particularly because the extension of a conductive element 102, 104, 105, 108A, 110, 112, even without creating a new EE spacing issue, will tend to increase parasitic resistance and capacitance as a result of the increased conductive element length.

Figure 2A:
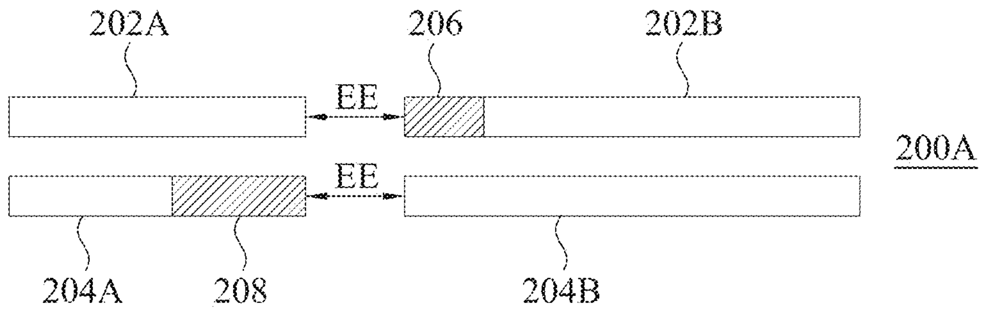
FIGS. 2A-2B are top views of integrated circuit layout cells including a pattern of horizontal parallel conductive lines arranged along two evenly spaced tracks and includes line density adjustments using dummy patterns according to some embodiments.

FIG. 2A is a top view of integrated circuit layout cell 200A including a pattern of horizontal parallel conductive elements 202A, 202B, 204A, 204B, arranged along two evenly spaced horizontal parallel tracks according to some embodiments. In FIG. 2A, the dummy pattern 206 has been used to extend the line end of conductive element 202B in order to reduce the end-to-end spacing with conductive element 202A to the minimum allowed EE spacing. Similarly, dummy pattern 208 has been used to extend the line end of conductive element 204A in order to reduce the end-to-end spacing with conductive element 204B to the minimum allowed EE spacing. Using dummy patterns to extend the length of one or more conductive elements 202A, 202B, 204A, 204B including one or more main conductive lines to reduce the end-to-end spacing comprising is characterized as a track-based fill method operating in the extension mode.

Figure 2B:
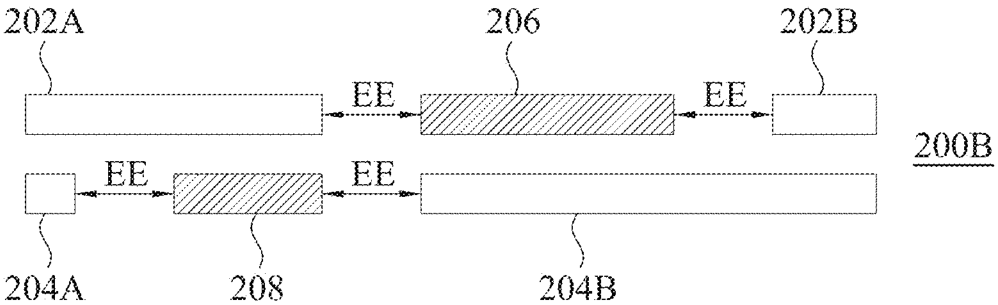

FIG. 2B is a top view of integrated circuit layout cell 200B including a pattern of horizontal parallel conductive elements 202A, 202B, 204A, 204B arranged along two evenly spaced horizontal parallel tracks according to some embodiments. In FIG. 2B, the dummy pattern 206 has been inserted between, and separated from, the line ends of conductive element 202A, 202B in order to fill a portion of the open area that existed between the two conductive elements and to reduce the end-to-end spacing between conductive elements 202A, 202B and the dummy pattern 206 to the minimum allowed EE spacing. Similarly, the dummy pattern 208 has been inserted between, and separated from, the line ends of conductive element 204A, 204B in order to fill a portion of the gap that existed between the two conductive elements and to reduce the end-to-end spacing between conductive elements 204A, 204B and the dummy pattern 208 to the minimum allowed EE spacing. Using one or more dummy patterns to fill a portion of the open area two conductive elements 202A, 202B, 204A, 204B comprising one or more main conductive lines to increase the local conductor density and to reduce the end-to-end spacing comprising to the minimum allowed EE spacing is characterized as a track-based fill method operating in the fill, fraction, or insertion mode.

Figure 3:
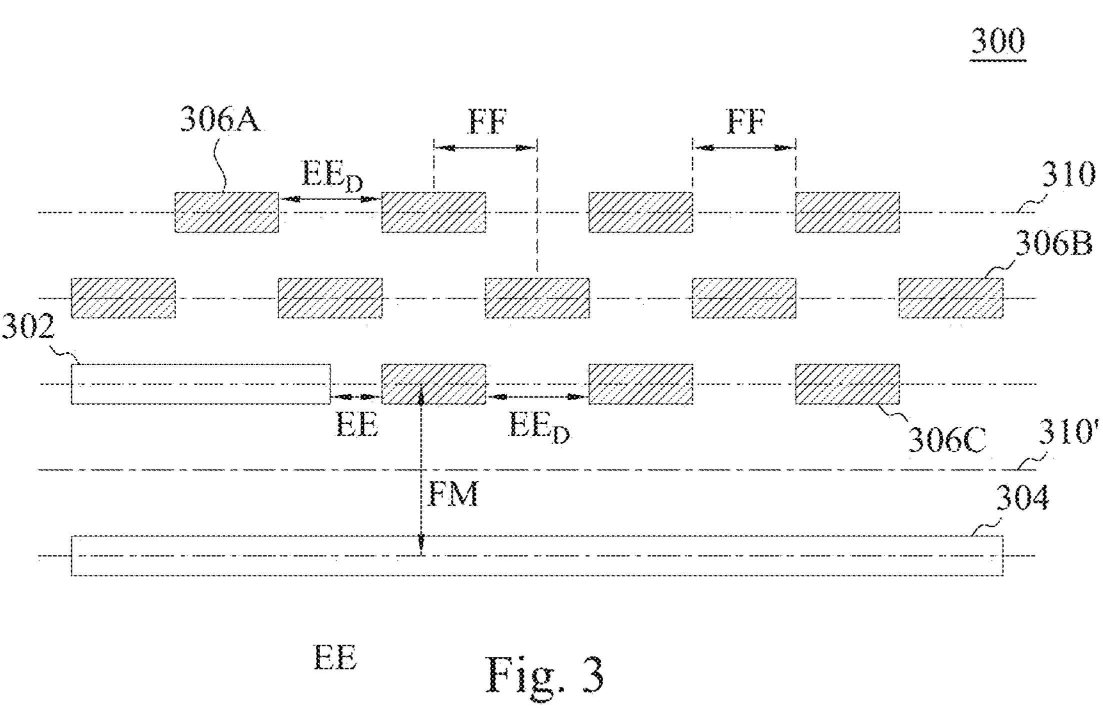
FIG. 3 is a top views of integrated circuit layout cell including a pattern of horizontal parallel conductive lines arranged along five evenly spaced tracks and includes line density adjustments using dummy patterns according to some embodiments.

FIG. 3 is a top view of integrated circuit layout cell 300 including a pattern of horizontal parallel conductive elements 302, 304 arranged along at least some of a plurality of evenly spaced tracks 310 according to some embodiments. Integrated circuit layout cell 300 also incorporates a spacer track 310' over which no conductive elements are patterned or etched to provide additional spacing between the conductive elements 302, 304 that form main conductive lines.

A number of dummy patterns 306A are arranged on portions of the tracks 310 that are not covered by the conductive element forming the main signal line. The dummy patterns 306A are separated by an end-to-end distance ($EE_D$). In some embodiments, $EE_D$ is smaller than the minimum EE distance permitted between the conductive elements comprising main conductive lines while in some embodiments $EE_D$ is equal to or greater than the minimum EE distance permitted between the conductive elements comprising main conductive lines. In some embodiments, adjacent rows of dummy patterns 306A maybe horizontally offset to provide a staggered fill-to-fill (also referred to as FF, $EE_F$, and/or F2F) (or dummy-to-dummy (also referred to as DD and/or D2D)) arrangement to increase local conductor density without a corresponding increase in the dummy-to-dummy (or dummy-to-main (also referred to as DM, $EE_{DM}$ and/or D2M)) parasitic capacitance and/or parasitic resistance.

In some embodiments, each of the dummy patterns 306A is characterized by a predetermined minimum area and are separated from each other by a predetermined end-to-end distance $EE_D$. In some embodiments, each of the spatial guidelines concerning the sizing, spacing, and/or relative positioning of the conductive elements comprising the main conductive lines and any dummy patterns being used to extend an end length of at least one of the conductive elements and/or being used between two conductive elements as one or more separate fill elements are incorporated into the design rules to permit the creation and placement of appropriate dummy patterns during an automatic placement and routing (APR) process.

In some embodiments, each of the spatial guidelines concerning the sizing, spacing, and/or relative positioning of the conductive elements comprising the main conductive lines and any dummy patterns being used to extend an end length of at least one of the conductive elements and/or being used between two conductive elements as one or more separate fill elements are utilized in the creation of the dummy pattern library from which a designer or the APR function are able to retrieve an appropriate dummy pattern to correct excessive the spacing between main conductive lines and/or increase the overall conductive layer density.

Figure 4A:
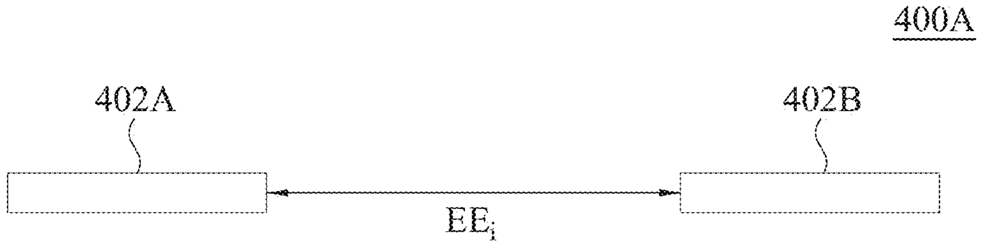
FIGS. 4A-4B are top views of integrated circuit layout cells including a horizontal conductive line arranged along a single track and illustrating line density adjustments using dummy patterns according to some embodiments.
Figure 4B:
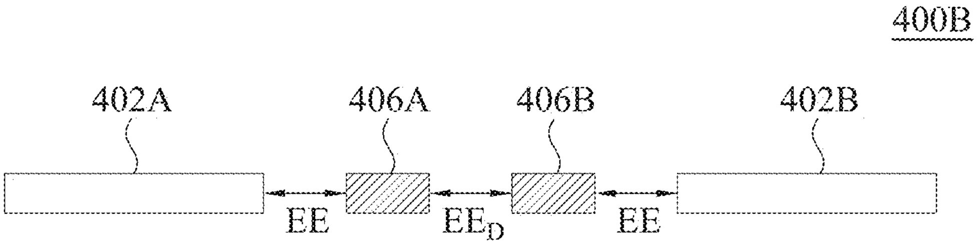

FIG. 4A is a top view of an integrated circuit layout cell 400A according to some embodiments which includes a first conductive element 402A and a second conductive element 402B separated by an initial open space corresponding to a relatively large end-to-end spacing $EE_i$. FIG. 4B is a top view an integrated circuit layout cell 400B including a horizontal metal line arranged along a single track and which includes a first conductive element 402A and a second conductive element 402B separated by an initial open space corresponding to an end-to-end spacing $EE_i$. In some embodiments, the initial open space is of sufficient size whereby two dummy patterns 406A, 406B are able to be inserted between the first and second conductive elements 402A, 402B while still maintaining the target EE spacing between a dummy pattern and a conductive element and the $EE_D$ spacing between the two dummy patterns.

Figure 5A:
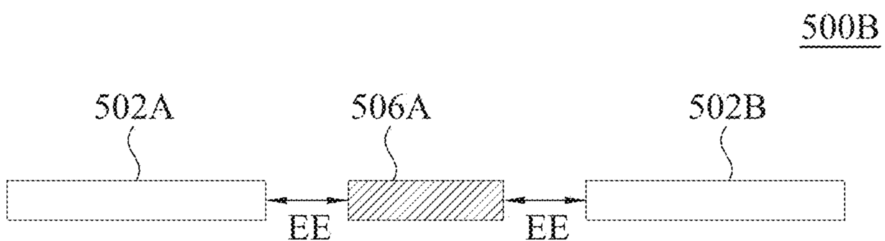
FIGS. 5A-5C are top views of integrated circuit layout cells including a horizontal conductive line arranged along a single track and illustrating line density adjustments using dummy patterns according to some embodiments.

FIG. 5A is a top view of an integrated circuit layout cell 500A according to some embodiments which includes a first conductive element 502A and a second conductive element 502B separated by a single dummy pattern 506A that meets at least the minimum size guideline $DL_{min}$ (a value set in the process design rules corresponding to the specific manufacturing process(es) that will be used for manufacturing an IC device according to the integrated circuit layout) for a dummy pattern. The fill pattern in FIG. 5A is able to be utilized whenever the initial open spacing $EE_i$ satisfies Formula 1.

$$EE_i \geq DL_{min} + 2\times(EE) \quad \text{[FORMULA 1]}$$

Figure 5B:
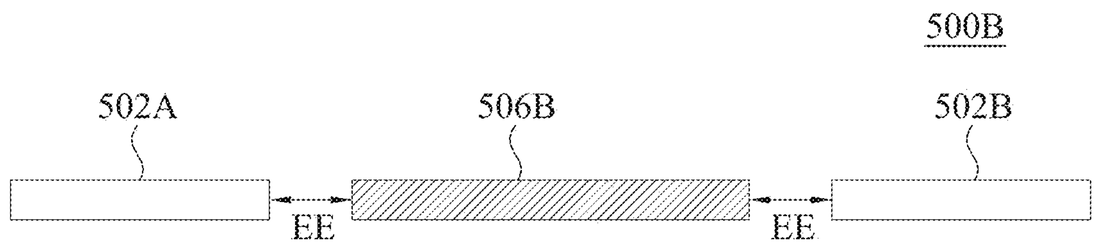

FIG. 5B is a top view of an integrated circuit layout cell 500B according to some embodiments which includes a first conductive element 502A and a second conductive element 502B separated by a single dummy pattern 506B that exceeds the minimum size guideline $DL_{min}$ for a dummy pattern without exceeding the maximum length $DL_{max}$ (a value set in the process design rules corresponding to the specific manufacturing process(es) that will be used for manufacturing an IC device according to the integrated circuit layout) for a dummy pattern. The fill pattern in FIG. 5B is able to be utilized whenever the initial open spacing $EE_i$ satisfies both Formulae 2 and 3.

$$EEi>DL_{min}+2\times(EE) \quad \text{[FORMULA 2]}$$

$$EEi\leq DL_{max}+2\times(EE) \quad \text{[FORMULA 3]}$$

Figure 5C:
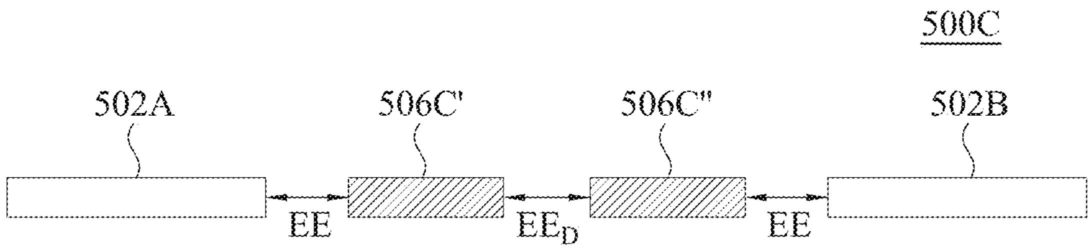

FIG. 5C is a top view of an integrated circuit layout cell 500C according to some embodiments which includes a first conductive element 502A and a second conductive element 502B separated by a pair of dummy patterns 506C', 506C" that meet the minimum size guideline $DL_{min}$ for a dummy pattern without exceeding the maximum length $DL_{max}$ for a dummy pattern. The fill pattern in FIG. 5C is able to be utilized whenever the initial open spacing $EE_i$ satisfies both Formulae 4 and 5.

$$EE_i>DL_{max}+2\times(EE)+EE_D \quad \text{[FORMULA 4]}$$

$$EE_i\geq 2DL_{min}+2\times(EE)+EE_D \quad \text{[FORMULA 5]}$$

Figures 6A, 6B:
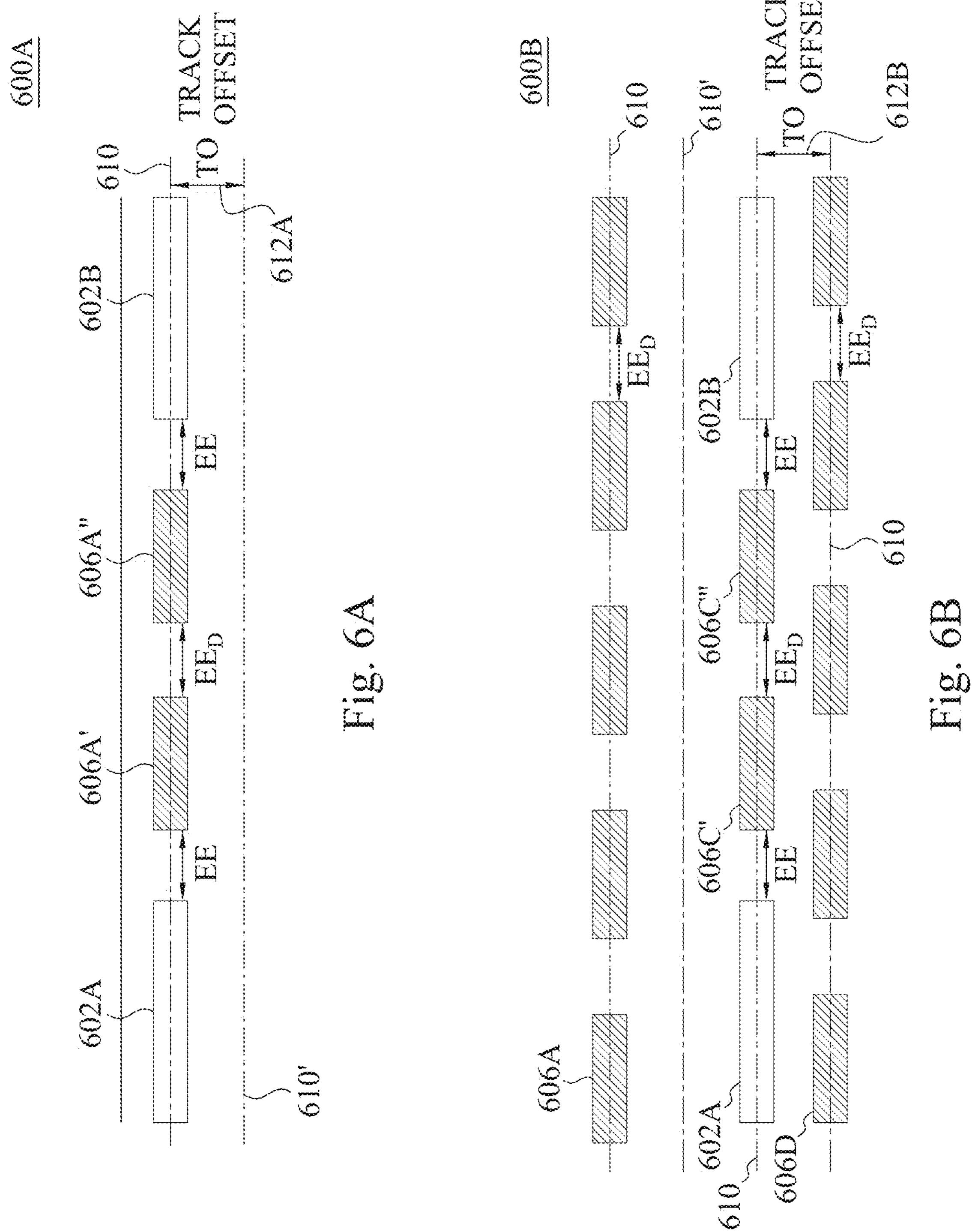
FIG. 6A is a top view of integrated circuit layout cell including a horizontal conductive line arranged along a single track adjacent a spacer track and includes line density adjustments using dummy patterns according to some embodiments.
FIG. 6B is a top view of integrated circuit layout cell including a series of horizontal conductive lines and a spacer track arranged along four parallel tracks and includes line density adjustments using dummy patterns according to some embodiments.

FIG. 6A is a top view of integrated circuit layout cell 600A which includes a first conductive element 602A and a second conductive element 602B separated by a pair of dummy patterns 606A', 606A" that meet the minimum size requirement $DL_{min}$ for a dummy pattern without exceeding the maximum length $DL_{max}$ for a dummy pattern. The fill pattern illustrated in FIG. 6A may be utilized in combination with a spacer track 610' on which no conductive element or dummy pattern is formed. The spacer track 610' is separated from the conductive elements 602A, 602B by a track offset spacing TO 612A. In some embodiments according to FIG. 6A, a combination of track-based fill methods using both extension mode (not shown) and fill mode operations are used for filling the open space.

FIG. 6B is a top view of integrated circuit layout cell 600B including horizontal conductive elements 602A and 602B arranged along a single track 610 adjacent a spacer track 610' according to some embodiments. A first conductive element 602A and a second conductive element 602B are separated by a pair of dummy patterns 606C', 606C". According to some embodiments, the track comprising the conductive elements may be flanked by a spacer track 610' and a first array of dummy patterns 606A and the second array of dummy patterns 606D. Both the spacer track 610' and the array of dummy patterns 606D will be separated from the conductive elements 602A, 602B by a track offset spacing TO 612B. In some embodiments according to FIG. 6B, a combination of track-based fill methods using both extension mode and fill mode operations (not shown) are used for filling the open space.

Figure 6C:
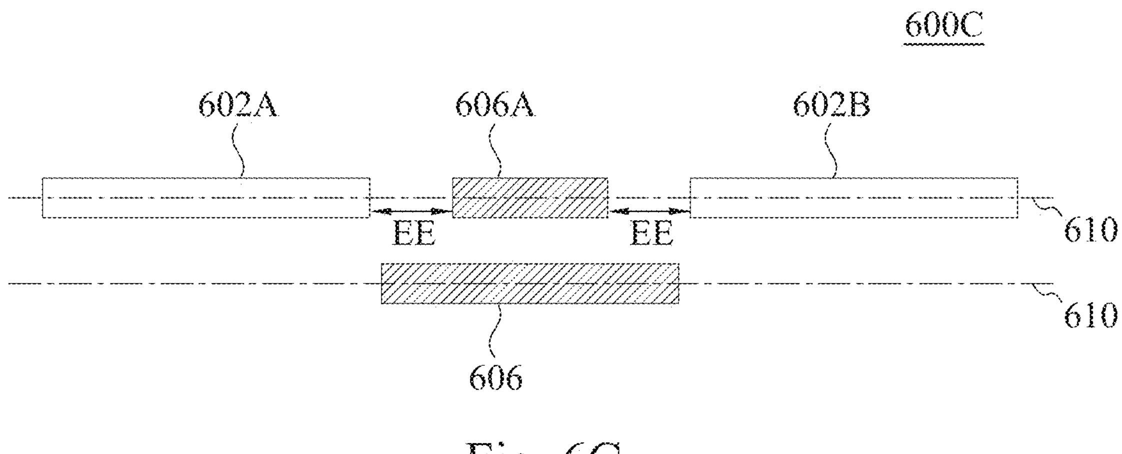
FIG. 6C is a top view of integrated circuit layout cell including a series of horizontal conductive lines arranged along two parallel tracks and includes line density adjustments using dummy patterns according to some embodiments.

FIG. 6C is a top view of integrated circuit layout cell 600C including a horizontal conductive element arranged along a single track 610 according to some embodiments which includes a first conductive element 602A and a second conductive element 602B separated by a dummy pattern 606' that meet the minimum size requirement $DL_{min}$ for a dummy pattern. As illustrated in FIG. 6C, the dummy pattern 606' can be used in those instances in which a larger dummy pattern 606, which, although in compliance with the maximum allowable length $DL_{max}$ for a dummy pattern, is too large to be used between conductive elements 602A, 602B.

Figure 6D:
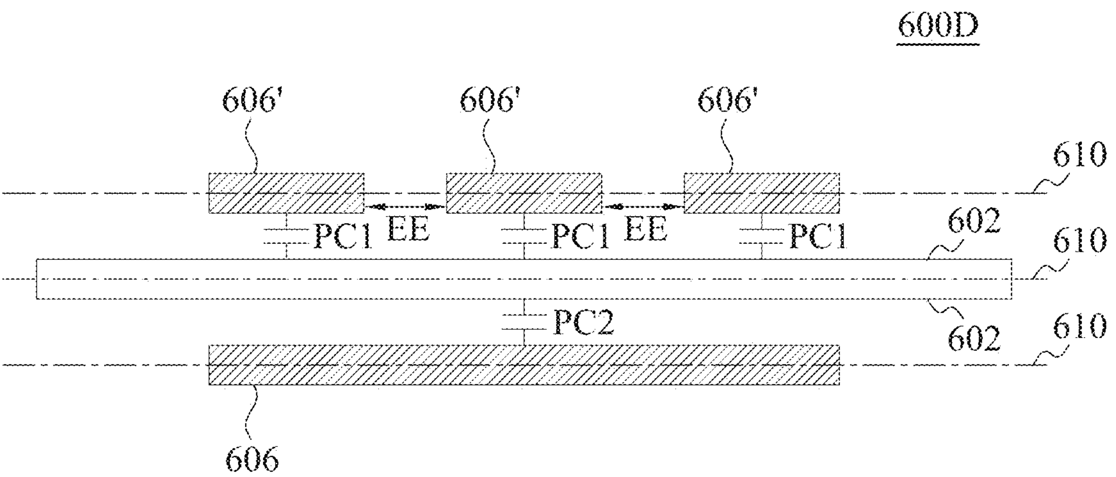
FIG. 6D is a top view of integrated circuit layout cell including a series of horizontal conductive lines and a spacer track arranged along three parallel tracks and includes line density adjustments using dummy patterns according to some embodiments.

FIG. 6D is a top view of integrated circuit layout cell 600D including a horizontal conductive element 602 arranged along a single track 610 according to some embodiments. The conductive element 602 is flanked on a first side by an array of dummy patterns 606' and on a second side by a single dummy pattern 606. The array of dummy patterns 606' and the larger dummy pattern 606 cover substantially the same length of conductive element 602. As indicated in FIG. 6D, each of the array of dummy patterns 606' will have a characteristic parasitic capacitance PC1 relative to the conductive element 602. Similarly, the larger dummy pattern 606 will have a characteristic parasitic capacitance PC2 relative to the conductive element 602. As a result of the inclusion of the dummy-to-dummy spacing $EE_D$ within the array of dummy patterns 606', the relationship PC2>3(PC1) is established, thereby reducing parasitic capacitance while maintaining an increased conductive element density relative to embodiments that do not include dummy patterns.

Figure 7:
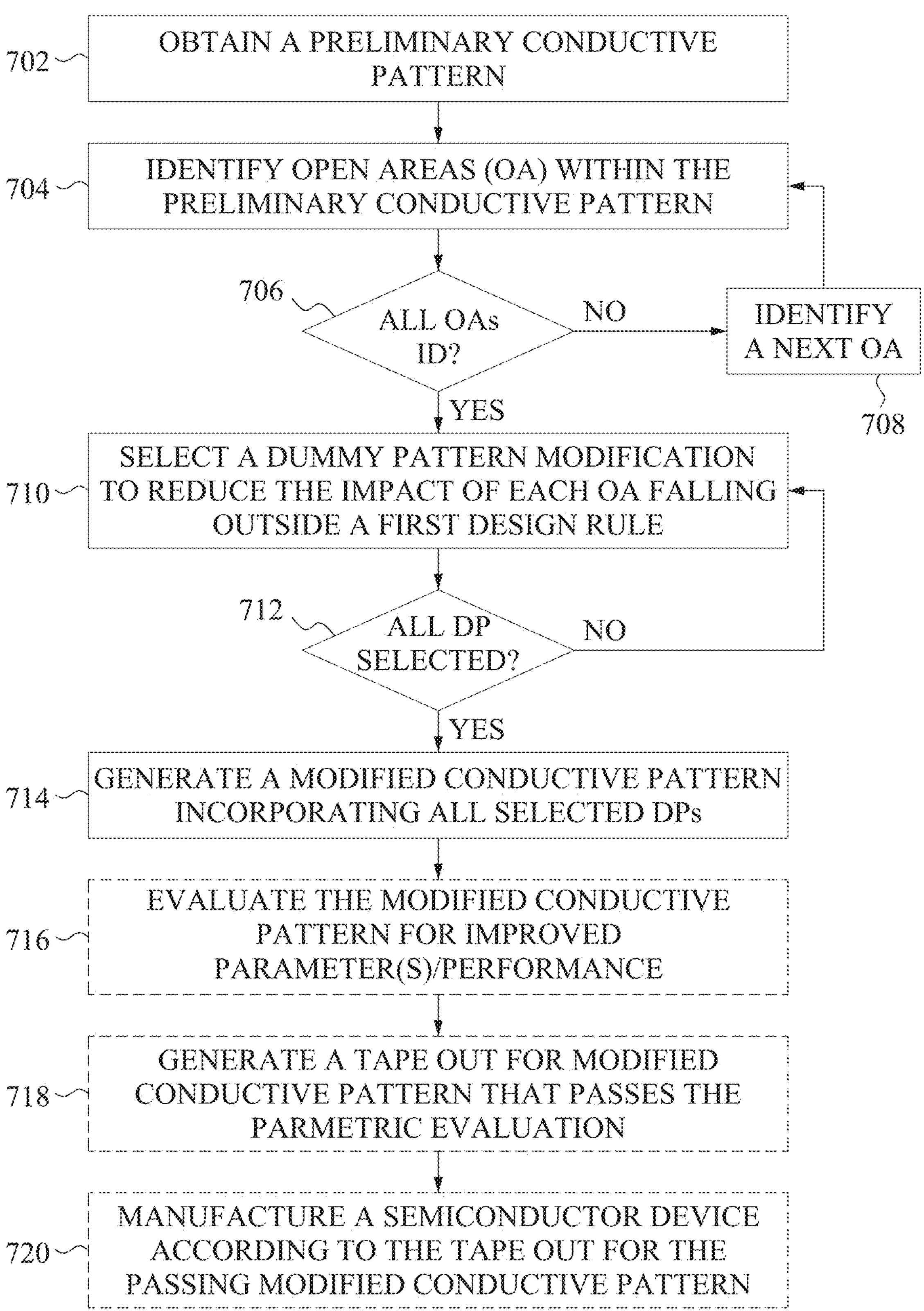
FIG. 7 is a flow diagram of a method for modifying an IC design layout to include dummy patterns in accordance with some embodiments.

FIG. 7 is a flowchart of a method 700 for improving the uniformity of the conductive (typically metal) patterning in connection with integrated circuit design by taking compensating for the degrading effects of the density gradient effect (DGE) resulting from gaps in the metal pattern through the addition of dummy metal patterns during an automatic placement and routing (APR) process.

In operation 702, a preliminary IC metal design layout comprising a preliminary conductive pattern is obtained, e.g., retrieved from a memory or input by a designer, for evaluation. In operation 704, the preliminary IC design file, or at least a preliminary conductive pattern, is evaluated to identify open areas (OA) in conductive, e.g., metal, patterns arranged along one or more designated tracks. Operation 706 involves a query regarding the extent to which the open areas have been successfully identified. If fewer than all of the open areas have been identified, method 700 branches from operation 706 to operation 708 in order to identify the next the open area for evaluation. When all of the open areas have been identified, method 700 branches to operation 710 for selecting a dummy pattern or patterns for each of the identified open areas. The selection of an appropriate dummy pattern in operation 710 involves an evaluation of the length of the open area and, in some embodiments, the classification of the conductive elements defining the open area, e.g., main conductive lines and/or dummy patterns, followed by the selection of, or generation of, a dummy pattern for placement in the open area. The selection and/or generation operations involve the application of guidelines and/or formulae associated with the specific manufacturing process(es) and the particular conductive pattern being formed, e.g., M0, M1, . . . Mx, during the production of the IC device.

In some embodiments, libraries of dummy patterns are available for a designer's selection and/or modification for use in an IC layout design. In some embodiments, the dummy patterns may be generated automatically during execution of the placement and routing process(es) based on a particular set of design rules corresponding to the intended IC manufacturing process, particularly with regard to one or more parameters including, for example, minimum lengths, minimum lengths, minimum areas, maximum areas, and minimum spacings. Each of the dummy patterns available in a library has passed the relevant technology rule checks (DRC) and are useful in addressing at least one of the types of open area configurations found in the IC layout design.

Because embodiments of the dummy patterns incorporate specific design rules for particular types open areas, DRC update revisions and node-to-node porting are simplified and able to be made efficiently across a family or a library of transition cell designs. In some embodiments, the library of dummy pattern designs includes dummy patterns suitable for positioning in open areas found for each of the various levels of conductive patterns/metal patterns incorporated within an IC layout design. For example, some embodiments include IC layout designs incorporating a standard threshold voltage (SVT), a low threshold voltage (LVT), and/or an ultralow threshold voltage (ULVT). The configuration of the dummy patterns according to some embodiments are modified whereby a dummy pattern is available for each of the various conductive/metal patterns found within active regions utilizing different operating voltages.

Some embodiments comprise methods including the operations of receiving a preliminary device layout including a plurality of conductive/metal patterns; analyzing the preliminary device layout to identify open areas found between various segments of the conductive/metal patterns; determining the configuration of one or more suitable dummy patterns from a dummy pattern library. These operations of analyzing the open areas in selecting suitable dummy patterns are continued until each of the open areas has been filled with a dummy pattern to produce a modified IC design layout incorporating the modified conductive pattern. In some embodiments, the modified IC design layout will be used to generate a tape out that can, in turn, be used, to manufacture an IC device according to the modified IC design layout.

Operation 712 involves a query regarding the extent to which the selection of appropriate dummy patterns for each of the identified open areas has been completed. If the selection of appropriate dummy patterns has not been completed, operation 712 branches back to operation 710 to continue with the selection of appropriate dummy patterns for each of the identified open areas.

Once appropriate dummy patterns have been selected for each of the open areas, operation 714 involves generating a modified conductive pattern in which selected dummy patterns are incorporated into the preliminary conductive pattern design layout and/or preliminary IC design layout.

In optional operation 716, the modified conductive pattern generated in operation 714 can be evaluated with respect to one or more parametric or performance values including, for example, conductor/metal density, parasitic capacitance, parasitic resistance, electromigration performance, self-heating, projected device lifetime, timing performance, core utilization, or other structural and/or operational values of interest to the designer and/or client. In some embodiments, the success of this evaluation, or evaluations, is judged against one or more target values, e.g., a metal density of at least 50%, and/or with respect to the degree of improvement observed relative to a corresponding evaluation or evaluations of the original and unmodified preliminary conductive pattern.

For those modified conductive patterns that pass the evaluation(s), method 700 includes an optional operation 718, in some embodiments, during which a tape out data file corresponding to the passing modified IC design layout incorporating the modified conductive pattern(s) is generated. For those modified IC design layouts for which a tape out data file is generated, the tape out data file will be used to manufacture a semiconductor device according to the passing modified IC design layout in optional operation 720.

Figure 8:
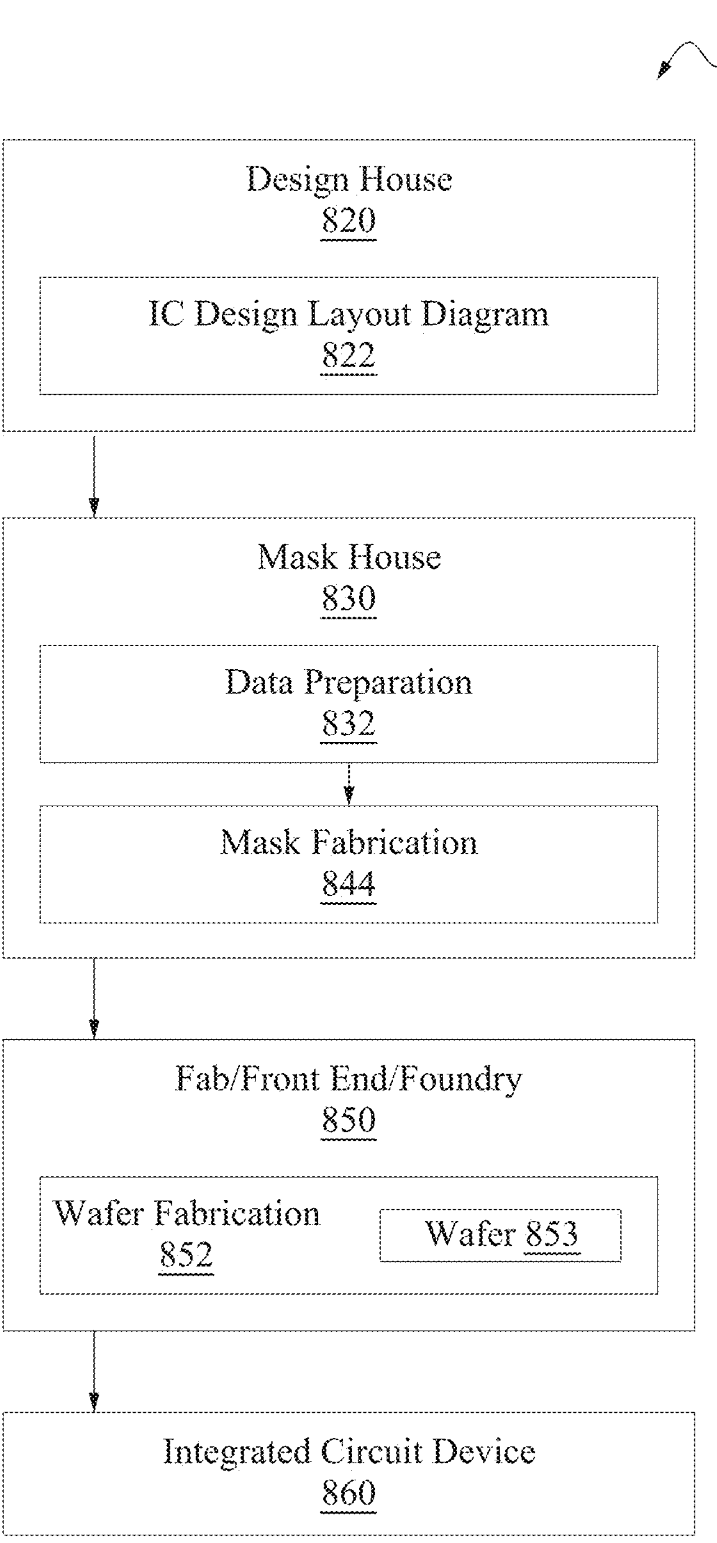
FIG. 8 is a block diagram of an integrated circuit manufacturing system and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 is be expressed in a GDSII file format or DFII file format, according to some embodiments.

Whereas the pattern of a modified IC design layout diagram is adjusted by a method such as Method 800, in order to reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 are collectively referred to as mask data preparation.

In some embodiments, mask data preparation 832 includes optical proximity correction (OPC) which uses lithography enhancement techniques to compensate for image errors, such as those that arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which undoes part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

One of ordinary skill in the art would understand that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 is executed in a variety of different orders, according to some embodiments.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. In some embodiments, mask 845 is formed in various technologies. In some embodiments, mask 845 is formed using binary technology.

In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask is attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 includes wafer fabrication 852. IC fab 850 is an IC fabrication business that includes one or more manufacturing facilities for the fabrication of a variety of different IC products. In some embodiments, IC Fab 850 is a semiconductor foundry. For example, according to some embodiments, a manufacturing facility for the front end fabrication of a plurality of IC products (front-end-of-line (FEOL) fabrication), while a second manufacturing facility is provided the back end fabrication for the interconnection and packaging of the IC products (back-end-of-line (BEOL) fabrication), and a third manufacturing facility is provided other services for the foundry business. In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit.

In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in operation 850.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art. In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind. In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multilevel interconnects, and the like (formed at subsequent manufacturing steps).

Figure 9:
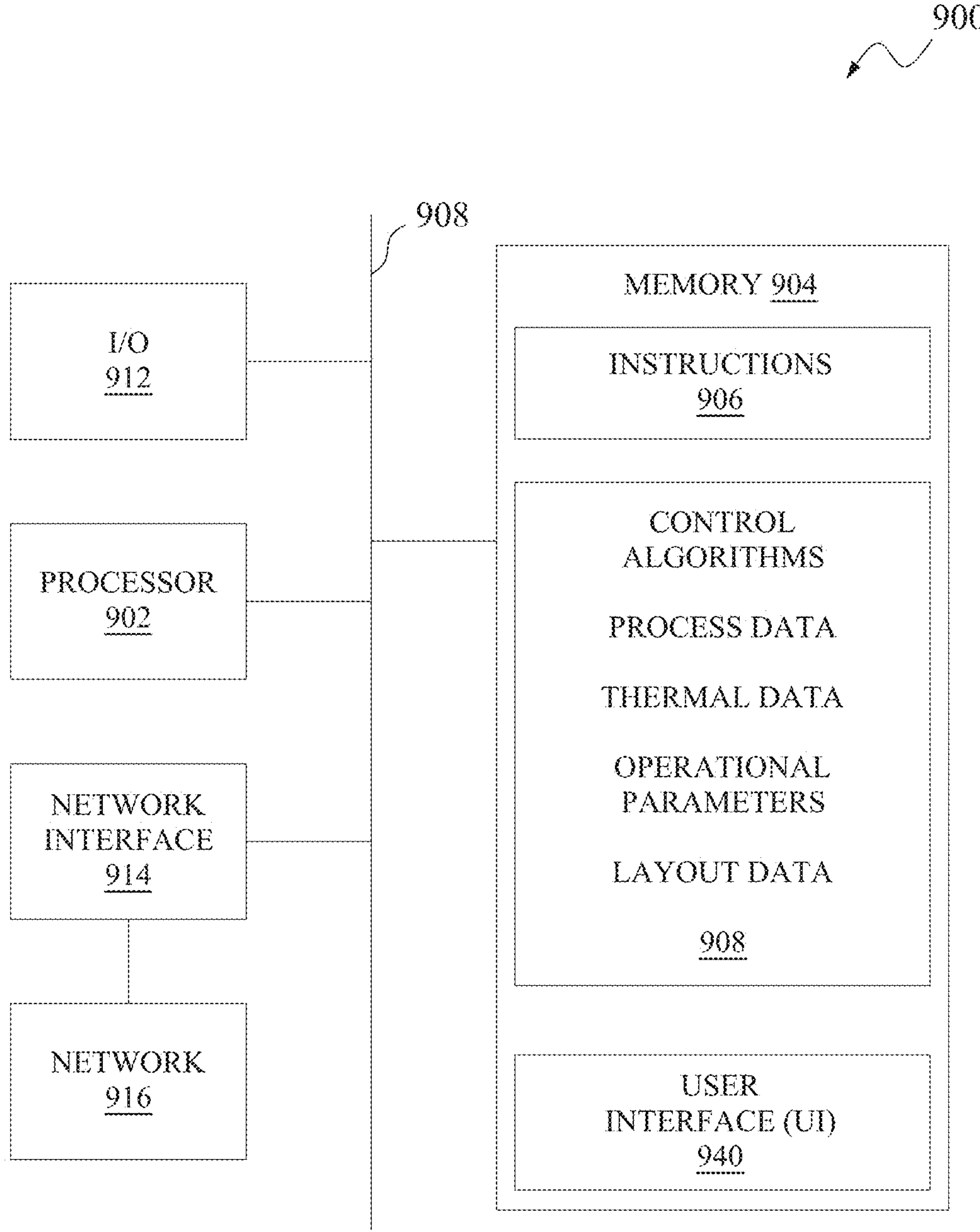
FIG. 9 is a schematic view of an electronic process control (EPC) system useful in the operation of an IC design layout modification in accordance with some embodiments.

FIG. 9 is a block diagram of an electronic process control (EPC) system 900, in accordance with some embodiments. Methods described herein of generating cell layout diagrams, in accordance with one or more embodiments, are implementable, for example, using EPC system 900, in accordance with some embodiments. In some embodiments, EPC system 900 is a general purpose computing device including a hardware processor 902 and a non-transitory, computer-readable storage medium 904. Storage medium 904, amongst other things, is encoded with, i.e., stores, computer program code (or instructions) 906, i.e., a set of executable instructions. Execution of computer program code 906 by hardware processor 902 represents (at least in part) an EPC tool which implements a portion or all of, the methods described herein in accordance with one or more (hereinafter, the noted processes and/or methods).

Hardware processor 902 is electrically coupled to computer-readable storage medium 904 via a bus 918. Hardware processor 902 is also electrically coupled to an I/O interface 912 by bus 918. A network interface 914 is also electrically connected to hardware processor 902 via bus 918. Network interface 914 is connected to a network 916, so that hardware processor 902 and computer-readable storage medium 904 are capable of connecting to external elements via network 916. Hardware processor 902 is configured to execute computer program code 906 encoded in computer-readable storage medium 904 in order to cause EPC system 900 to be usable for performing a portion or all of the noted processes and/or methods. In one or more embodiments, hardware processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EPC system 900 (where such execution represents (at least in part) the EPC tool) to be usable for performing a portion or all of the noted processes and/or methods. In one or more embodiments, storage medium 904 also stores information which facilitates performing a portion or all of the noted processes and/or methods. In one or more embodiments, storage medium 904 stores process control data 908 including, in some embodiments, control algorithms, active area data, transition cell data, uniformity algorithms, layout data, and constants, target ranges, set points, and code for enabling statistical process control (SPC) and/or model predictive control (MPC) based control of the various processes.

EPC system 900 includes I/O interface 912. I/O interface 912 is coupled to external circuitry. In one or more embodiments, I/O interface 912 includes a keyboard, keypad, mouse, trackball, trackpad, touchscreen, and/or cursor direction keys for communicating information and commands to hardware processor 902.

EPC system 900 also includes network interface 914 coupled to hardware processor 902. Network interface 914 allows EPC system 900 to communicate with network 916, to which one or more other computer systems are connected. Network interface 914 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 900.

EPC system 900 is configured to receive information through I/O interface 912. The information received through I/O interface 912 includes one or more of instructions, data, design rules, process performance histories, target ranges, set points, and/or other parameters for processing by hardware processor 902. The information is transferred to hardware processor 902 via bus 918. EPC system 900 is configured to receive information related to a user interface (UI) through I/O interface 912. The information is stored in computer-readable medium 904 as user interface (UI) 910.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 900.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

According to some embodiments, methods are provided for designing a semiconductor device including the operations of analyzing an initial semiconductor design layout to identify an open space within a first interconnection layer pattern, selecting a first dummy pattern to fill a portion of the open space, and generating a modified semiconductor design layout by incorporating the first dummy pattern into the first interconnection layer pattern. According to some embodiments. methods include operations including outputting the modified semiconductor design layout, positioning the first dummy pattern within the open space to be in direct electrical contact with a portion of the first interconnection layer pattern, and/or positioning the first dummy pattern within the open space to be electrically separated from the first interconnection layer pattern. According to some embodiments, the first dummy pattern includes both a first portion that is in direct electrical contact with the first interconnection layer pattern and a second portion that is electrically separated from the first interconnection layer pattern, according to other embodiments the first dummy pattern includes a first portion that is electrically separated from the first interconnection layer pattern and a second portion that is electrically separated from the first interconnection layer pattern. According to some embodiments, the first interconnection layer pattern includes main conductive element aligned along a first track, a first dummy pattern aligned along the first track, and a second dummy pattern aligned along a second track, the second track being parallel to the first track. According to some embodiments, the first interconnection layer pattern includes a spacer track parallel to the first and second tracks, with the spacer track not including any conductive elements and/or dummy pattern. According to some embodiments, the spacer track is arranged between the first track and the second track.

According to some embodiments, methods for revising a conductive pattern layout for a semiconductor device design include the operations of setting a first design rule for an end-to-end spacing requirement for open areas between adjacent first and second conductive elements, identifying a first open area in an initial conductive pattern layout that is outside the first design rule; selecting a first dummy pattern for covering a first portion of the first open area whereby a residual second open area is within the first design rule, and positioning the first dummy pattern within the first open space to produce a revised conductive pattern layout. Some embodiments include additional operations including setting a second design rule for a maximum area requirement for the first dummy pattern, identifying a first dummy pattern in a revised conductive pattern layout that is outside the second design rule, selecting a second dummy pattern for replacing the first dummy pattern in which the second dummy pattern includes at least two dummy pattern elements that are each within the second design rule, replacing the first dummy pattern with the second dummy pattern to produce the revised conductive pattern layout. Some embodiments include additional operations including identifying a third open area having an end-to-end spacing length L3 that is outside the first design rule, generating a third dummy pattern in accord with the second design rule so that positioning the third dummy pattern within the third open area leaves a residual fourth open area that is within the first design rule, storing the generated third dummy pattern in a memory device for subsequent retrieval for placement within an interconnection layer pattern that has one or more open spaces having an end-to-end spacing length of L3.

According to some embodiments, a semiconductor device has an interconnection pattern with at least two parallel tracks, first and second conductors aligned with a first track, the first and second conductors being separated by an open space; and a first dummy pattern aligned with the first track and positioned within the open space. According to some embodiments, the first dummy pattern is in direct electrical contact with the first conductor and the first dummy pattern is electrically isolated from the second conductor. According to some embodiments, the first dummy pattern is electrically isolated from both the first and second main conductors. According to some embodiments, a semiconductor device includes a second dummy pattern aligned with a second track with the second dummy pattern including at least two conductive elements, a spacer track parallel to and arranged between the first and second tracks, a third dummy pattern comprising at least two conductive elements aligned with a third track that is arranged immediately adjacent the first track, and/or the conductive elements comprising the second dummy pattern define a first array, the plurality of conductive elements comprising the third dummy pattern define a second array, and the first and second arrays are arranged in a staggered offset configuration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A semiconductor device comprising:

an interconnection pattern;

a first conductor having a length $L_{C1}$;

a second conductor having a length $L_{c2}$;

a first dummy pattern offset from a first side of the first conductor by an axis offset distance $L_{AO}$;

wherein the first dummy pattern comprises N first dummy conductors, each having a first dummy conductor length $L_{D1}$ and each of the N first dummy conductors is separated from an adjacent first dummy conductor of the N first dummy conductors by a dummy conductor end-to-dummy conductor end spacing $EE_D$; and an inline dummy pattern coaxial with the first active conductor and the second conductor, wherein each of the first active conductor and the second conductor is spaced from the inline dummy pattern by a distance other than $EE_D$, and a first distance from the first active conductor to the inline dummy pattern is different from a second distance from the second active conductor to the inline dummy pattern.

2. The semiconductor device according to claim 1, further comprising:

a second dummy pattern offset from the first conductor on the first side of the first conductor by an integer multiple of the axis offset distance $L_{AO}$ wherein the integer multiple is at least 2;

wherein the second dummy pattern comprises M dummy conductors, each having the first dummy conductor length $L_{D1}$ and separated from an adjacent second dummy conductor of the M dummy conductors by the dummy conductor end-to-dummy conductor end spacing $EE_D$, and wherein the second dummy pattern is offset in an axial direction from the first dummy pattern by a dummy pattern offset distance $L_{DPO}$.

3. The semiconductor device according to claim 2, wherein:

the dummy pattern offset distance $L_{DPO}$ is at least 25% of the first dummy conductor length $L_{D1}$.

4. The semiconductor device according to claim 2, wherein:

the dummy pattern offset distance $L_{DPO}$ is at least 50% of the first dummy conductor length $L_{D1}$.

5. The semiconductor device according to claim 2, wherein:

the dummy pattern offset distance $L_{DPO}$ at least 75% of the first dummy conductor length $L_{D1}$.

6. The semiconductor device according to claim 2, wherein:

a dummy conductor overlap length $L_O$ between the first dummy pattern and the second dummy pattern is 0.

7. The semiconductor device according to claim 2, further comprising:

a space having no conductor or dummy pattern on a second side of the first conductor, wherein the space is offset from the first conductor by an integer multiple of the axis offset distance $L_{AO}$, wherein the integer multiple is at least 1.

8. The semiconductor device according to claim 7, wherein:

a second conductor on the second side of the first conductor is offset from the first conductor by an integer multiple of the axis offset distance $L_{AO}$, wherein the integer multiple is at least 2.

9. The semiconductor device of claim 1, wherein the first distance is 0.

10. The semiconductor device of claim 9, wherein the second distance is greater than spacing $EE_D$.

11. A semiconductor device comprising:

a first conductor segment aligned with a first axis;

a second conductor segment aligned with the first axis, wherein the first conductor segment and the second conductor segment are separated by a first end-to-end spacing that exceeds a first design rule;

a first dummy pattern aligned with the first axis and between the first conductor segment and the second conductor segment whereby any remaining end-to-end spacing between the first conductor segment and the second conductor segment complies with the first design rule, wherein the first dummy pattern is on a same layer of an interconnect structure as the first conductor segment, and each of the first conductor and the second conductor is spaced from the first dummy pattern by a first distance;

a third conductor segment aligned with a second axis, wherein the second axis is parallel to and offset from a first axis by an axis offset distance $L_{AO}$;

a fourth conductor segment aligned with the second axis, wherein the third conductor segment and the fourth conductor segment are separated by a second end-to-end spacing that exceeds the first design rule; and a second dummy pattern aligned with the second axis and between the third conductor segment and the fourth conductor segment whereby any remaining end-to-end spacing between the third conductor segment and the fourth conductor segment complies with the first design rule; and a third dummy pattern along with the second axis, wherein the second dummy pattern is spaced from the third dummy pattern by a second distance, less than the first distance, the first dummy pattern comprises a plurality of N first dummy segments, wherein each first dummy segment of the plurality of N first dummy segments has a length $L_{D1}$ and is separated from an adjacent first dummy segment of the plurality of N first dummy segments by a first dummy segment-to-first dummy segment spacing $EE_{D1}$; and the second dummy pattern comprises a plurality of M second dummy segments, wherein each second dummy segment of the plurality of M second dummy segments has a second dummy segment length $L_{D2}$ and is separated from an adjacent second dummy segment of the M second dummy segments by a second dummy segment-to-second dummy segment spacing $EE_{D2}$, a third dummy pattern aligned with a third axis and offset from both the first axis and the second axis an integer multiple of the axis offset distance $L_{AO}$;

wherein the third dummy pattern comprises a plurality of O third dummy segments, wherein each third dummy segment of the plurality of O third dummy segments has a third dummy segment length $L_{D3}$ and is separated from an adjacent third dummy segment of the plurality of O third dummy segments by a third dummy segment-to-third dummy segment spacing $EE_{D3}$,

N=O;

$L_{D2}=L_{D3}$; and the second dummy pattern is axially offset relative to the third dummy pattern to establish an overlap length $L_O$ between the M second dummy segments and the O third dummy segments that satisfies a relationship $L_O<L_{D2}$.

12. The semiconductor device according to claim 11, wherein:

the first dummy pattern comprises a single first dummy pattern segment extending from the first conductor segment or the second conductor segment; and the second dummy pattern comprises a single second dummy pattern segment extending from the third conductor segment or the fourth conductor segment.

13. The semiconductor device according to claim 11, wherein:

the first dummy pattern comprises a single first dummy pattern segment between and separate from the first conductor segment and the second conductor segment; and the second dummy pattern comprises a single second dummy pattern segment between and separate from the third conductor segment or the fourth conductor segment.

14. A semiconductor device comprising:

an interconnection pattern comprising:

a plurality of conductor segments extending along a corresponding plurality of parallel axes; and a plurality of dummy segments, wherein each of the plurality of conductor segments is on a same layer of the interconnect pattern as the plurality of dummy segments, wherein each of the conductor segments is separated from all adjacent coaxial conductor segments and coaxial dummy segments by a first end-to-end spacing EE, adjacent dummy segments of the plurality of dummy segments are separated by spacing $EE_D$, less than the spacing EE, a first dummy segment of the plurality of dummy segments is coaxial with a first conductor segment of the plurality of conductor segments, and the first dummy segment is separated from the first conductor segment by the spacing EE.

15. The semiconductor device according to claim 14, wherein:

a first plurality of segments consisting of a first set of dummy segments of the plurality of dummy segments is aligned along a same axis of the plurality of parallel axes.

16. The semiconductor device according to claim 14, wherein:

a first set of segments consisting of at least one conductive segment of the plurality of conductive segments is aligned along a same axis of the plurality of parallel axes.

17. The semiconductor device according to claim 14, wherein:

a first plurality of segments consisting of a first set of dummy segments of the plurality of dummy segments is aligned along a first axis of the plurality of parallel axes; and a second plurality of segments consisting of a second set of dummy segments of the plurality of dummy segments is aligned along a second axis of the plurality of parallel axes.

18. The semiconductor device of claim 14, wherein a second conductor segment of the plurality of conductor segments is on a first axis and the first axis is free of the plurality of dummy segments.

19. The semiconductor device of claim 14, wherein a set of the plurality of dummy segments extends along a dummy axis parallel to each of the plurality of axes, wherein the dummy axis is free of the plurality of conductor segments.

20. The semiconductor device of claim 14, wherein the plurality of dummy segments comprises:

a second dummy segment extending along a first axis parallel to the plurality of axes;

a third dummy segment extending along the first axis, wherein a distance between an end of the second dummy segment and an end of the third dummy segment is a first distance; and a fourth dummy segment extending along a second axis parallel to the first axis, wherein a center of the second dummy segment is offset from a center of the fourth dummy segment in a direction parallel to the second axis by the first distance.

* * * * *